(12) United States Patent
Fruehauf et al.

(10) Patent No.: US 7,723,175 B2
(45) Date of Patent: May 25, 2010

(54) METHOD FOR MANUFACTURING CMOS CIRCUITS

(75) Inventors: Norbert Fruehauf, Sindelfingen (DE);
Holger Baur, Durlangen (DE);
Efstathios Persidis, Stuttgart (DE);
Patrick Schalberger, Friolzheim (DE)

(73) Assignee: Universitaet Stuttgart, Stuttgart (DE)

( * ) Notice: Subject to any disclaimer, the term of this patent is extended or adjusted under 35 U.S.C. 154(b) by 645 days.

(21) Appl. No.: 11/542,779

(22) Filed: Oct. 4, 2006

(65) Prior Publication Data
US 2007/0207576 A1 Sep. 6, 2007

(30) Foreign Application Priority Data
Mar. 1, 2006 (DE) .................. 10 2006 009 280

(51) Int. Cl.
*H01L 21/8238* (2006.01)
(52) U.S. Cl. ................. 438/218; 257/E21.624
(58) Field of Classification Search .......... 438/218, 438/220, 491; 257/E21.642
See application file for complete search history.

(56) References Cited

U.S. PATENT DOCUMENTS 5,606,179 A 2/1997 Yamazaki et al.
6,323,068 B1 * 11/2001 Seo ........................... 438/154
2004/0197967 A1 10/2004 Chen

FOREIGN PATENT DOCUMENTS

EP 0 923 134 6/1999

OTHER PUBLICATIONS

H. Baur et al "Distinguished Student Paper: An LPTS Active-Matrix Process Without Ion Doping", SID Symposium Digest of Technical Papers, May 2005, vol. 36, NR. 1, S. 1266-1269.

* cited by examiner

*Primary Examiner*—Chandra Chaudhari
(74) *Attorney, Agent, or Firm*—Michael J. Striker

(57) ABSTRACT

A method of manufacturing transistors of a first and second type on a substrate includes producing doped semiconductor areas with a first conductivity type in eventual contact areas of a first type of transistors, depositing a first intrinsic semiconductor layer over an entire surface, activating dopants in the semiconductor areas such that a contact area with the first conductivity type is produced in the intrinsic semiconductor layer, depositing a gate dielectric, producing a gate electrode by depositing a first conductive layer and patterning the first conductive layer, performing ion doping with dopants to produce contact areas with a second conductivity type for a second type of transistor, depositing a passivation layer, opening contact openings, and depositing and patterning a second conductive layer.

14 Claims, 6 Drawing Sheets

METHOD FOR MANUFACTURING CMOS CIRCUITS

CROSS-REFERENCE TO A RELATED APPLIACTION

The invention described and claimed hereinbelow is also described in German Patent Application DE 10 2006 009-280.5 filed on Mar. 1, 2006. This German Patent Application, whose subject matter is incorporated here by reference, provides the basis for a claim of priority of invention under 35 U.S.C. 119(a)-(d).

BACKGROUND OF THE INVENTION

The present invention relates to a method for manufacturing transistors of a first and second type, in particular thin-film transistors, on a substrate, and a transistor configuration.

Integrated circuits, in particular CMOS circuits, are manufactured using a large number of process steps. The manufacturing costs of these circuits are determined by the process complexity and the processing time. Highly-complex components often require many hundreds of individual process steps and take many days to complete the process for the product. Some of the process steps must be devoted to producing the individual active components. For example, at least six masking steps are required to manufacture CMOS transistors using conventional methods. One masking step is required to pattern each of the following:
  the channel,
  the n⁺ drain/source areas (contact areas of a first type of transistor);
  the p⁺ drain/source areas (contact areas of a second type of transistor);
  the gate electrode;
  the contact holes through a gate dielectric;
  the contact metallization.

In the related art, LDD (lightly doped drain) areas adjacent to the drain-source areas often require an additional mask.

A method of this type is made known in US 2004/0197967 A1, for example. Areas for transistors of a first and second type are defined on a substrate; this is where n-channel and p-channel transistors will be subsequently produced. The first mask is used to define the semiconductor islands in which the transistor channels will be located.

The gate dielectric is now deposited, and a second photomask and doping are used to create the drain/source areas of the n-channel transistors, and a third photomask and doping are used to define the drain/source areas of the p-channel transistors. The gate metallization is now placed on this, and it is patterned using the fourth mask. An intermediate insulation is subsequently deposited, into which holes are etched, using the fifth mask. These holes are filled with a metal, and they are patterned for metallization, using a sixth mask.

It is always desirable to have the fewest number of process steps and masking steps possible in a process, in order to reduce the manufacturing costs and throughput time.

SUMMARY OF THE INVENTION

The object of the present invention, therefore, is to provide a method for manufacturing transistors that requires a minimum number of process steps and masking steps.

This object is attained according to the present invention using a method for manufacturing transistors of a first and second type, in particular thin-film transistors, on a substrate, with the method steps:

a) Produce doped semiconductor areas with a first conductivity type in contact areas of the first type of transistors;
b) Deposit a first intrinsic semiconductor layer over the entire surface;
c) Activate the dopants in the semiconductor islands such that a contact area with the first conductivity type is produced in the intrinsic semiconductor layer;
d) Deposit a gate dielectric;
e) Produce a gate electrode by depositing a first conductive layer and patterning this layer;
f) Perform ion doping with dopants to produce contact areas with a second conductivity type for a second type of transistor;
g) Deposit a passivation layer;
h) Open contact openings;
i) Deposit and pattern a second conductive layer.

With this method, it is possible to produce a transistor configuration with transistors of a first and second type, and only five photomasks are required. The first intrinsic semiconductor layer can be used as a channel for the first and second types of transistors. In addition, transistors of a second type can be easily created in this layer. Due to the fact that the dopants are activated in the semiconductor areas and therefore diffuse into the intrinsic semiconductor layer deposited thereon, it is not necessary to implant the intrinsic semiconductor layer of the first type of transistor. Preferably, only one mask is used to open the contact holes in the semiconductor and reach the first conductive layer.

Ion doping of the contact areas of the first type of transistors with dopants for a first conductivity type can be avoided entirely when the doped semiconductor areas are produced by depositing a doped semiconductor layer and then patterning it. A first photomask is needed for the patterning. The doped semiconductor layer can be deposited in an amorphous, microcrystalline, polycrystalline or monocrystalline state.

As an alternative, it is also feasible to produce the doped semiconductor areas by depositing a second, intrinsic semiconductor layer, doping it—using ion doping, in particular—and patterning it.

It is also possible to activate the dopants by applying heat, e.g., in an furnace. The dopants in the doped semiconductor areas are preferably activated using a laser. This allows the process temperatures to be kept low.

With a method variant it can be provided that the first intrinsic semiconductor layer is deposited as an amorphous or microcrystalline layer and is subsequently crystallized, particularly so that it forms a polycrystalline layer. The crystallization and activation of the dopants can take place in the same process step.

Activation and crystallization are preferably carried out in one step using a laser.

A buffer layer is preferably deposited under the doped semiconductor areas and on the substrate, to protect it. This also protects the semiconductor. The buffer layer serves as a diffusion barrier, among other things.

With a particularly preferred method variant, it can be provided that the first intrinsic semiconductor layer is patterned such that semiconductor islands are retained at least in contact areas for the first and second type of transistors, preferably in contact and channel areas. As mentioned above, a second type of transistor can be formed in the intrinsic semiconductor layer. The intrinsic semiconductor layer can also be used as a channel for the first type of transistor.

In a preferred embodiment of the method it can be provided that the first conductive layer for producing the gate electrodes is patterned such that the assigned, eventual channel, at the least, is covered by the gate electrodes of the transistors.

Via this action, the gate electrodes can be used as a mask for subsequent implantation with dopants. A separate mask for doping can therefore be eliminated.

An embodiment of the method is characterized by the fact that ion doping is carried out with at least the gate electrodes of the second type of transistor as a mask such that, in the contact areas with the first conductivity type, this first conductivity type is retained, and the contact areas of the second type of transistors have a second conductivity type. The implanted contact areas of the second type of transistors are therefore self-adjusted. The areas in which transistors of the first type are created can be covered by a mask to prevent dopants for the second type of transistors from reaching the areas of the first type of transistors. As an alternative, it is also feasible to keep the doping-agent concentration of the dopants for the second type of transistor so low that the portion of dopants used to produce a first conductivity is greater.

Preferably, the first conductive layer is patterned such that the gate electrodes of the first type of transistor overlap at least part of the contact areas. The overhanging gate electrode ensures that the channel is also controlled. A portion of the contact areas with the first conductivity type is therefore shadowed when the ion-doping is carried out. Reliable control of the channel is therefore ensured.

It is particulary advantageous when the doped semiconductor islands are $n^+$ doped such that the concentration is higher than that of the subsequently ion-doped acceptors, and areas with a low concentration of doping agent are produced by activating the dopants in the direction of the channel. LDD areas can therefore be created without the use of any additional masks. With this approach, n-channel transistors can be produced for the manufacture of CMOS components by deposting an $n^+$-doped semiconductor, and p-channel transistors can be produced via ion implantation. It is possible to produce the n-channel and p-channel transistors in any order. It is also feasible, in particular, to deposit a p-doped semiconductor to produce the first type of transistors.

The scope of the present invention also includes a transistor configuration that includes at least one transistor of the first type, and one transistor of the second type, with:
a) doped semiconductor areas with a first conductivity type in contact areas of the first type of transistor;
b) a first semiconductor layer doped with dopants of the doped semiconductor islands deposited thereon;
c) a gate dielectric;
d) a gate electrode composed of a first conductive layer;
e) ion-doped contact areas of a second conductivity type of a second type of transistor;
f) a passivation layer;
g) a second conductive layer.

A transistor configuration of this type is characterized by the fact that it can be produced using just five masks. The manufacture therefore requires very little effort, time and expense. Additional conductive layers can be used to create connections in accordance with the desired switching properties of the transistor configuration.

Preferably, the first semiconductor layer is deposited as an intrinsic semiconductor layer that is doped in contact areas for the first type of transistors via subsequent activation, and out of which—after appropriate patterning—the channel region for the first and second type of transistors is formed.

With a preferred embodiment, it can be provided that the contact areas of the second type of transistor are formed in the first semiconductor layer, the ion doping of the contact areas being self-adjusted. The gate electrode of this transistor acts as a barrier for the ion doping in the area of the channel of this transistor. The contact areas are therefore self-adjusted to the gate electrode. Given that the gate electrode is used as a mask, a photomask can be eliminated. Incineration of the resist mask is not necessary, either.

With a further embodiment, it can be provided that the gate electrode of the first type of transistor overlaps the contact areas of this transistor. As a result, reliable control of the channel can be ensured.

With an embodiment of the present invention, the transistor with $n^+$-doped contact areas can include areas with lower doping (LDD). These areas with lower doping can be created, in particular, via diffusion during the laser crystallization of the intrinsic semiconductor layer in the direction of the channel.

Further features and advantages of the present invention result from the detailed description of exemplary embodiments of the invention presented below with reference to the figures in the drawing, which shows the details that are essential to the present invention. Further features and advantages of the present invention also result from the claims. The individual features can be realized individually, or they can be combined in any possible manner in different variations of the present invention.

The novel features of the which are considered as characteristic for the present invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1:
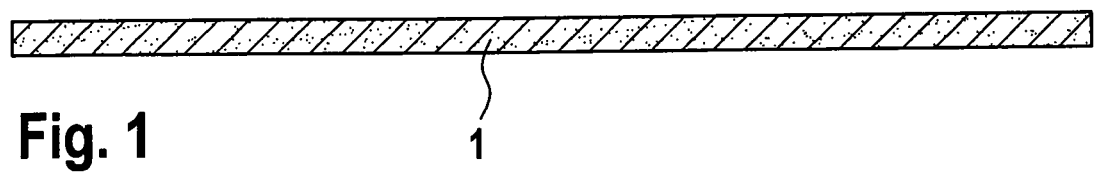
FIGS. 1 through 11 are schematic depictions that demonstrate the manufacture of a transistor configuration according to the present invention with a sequence of corresponding steps of the manufacturing process.
Figure 2:
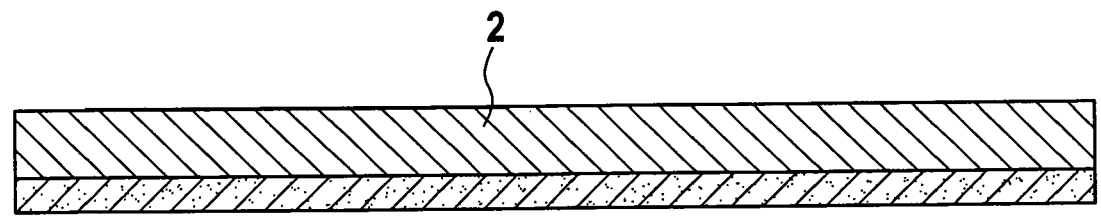

As shown in FIG. 2, a buffer layer 2 for protecting substrate 1 is first deposited on a substrate 1 shown in FIG. 1.

Figure 3:
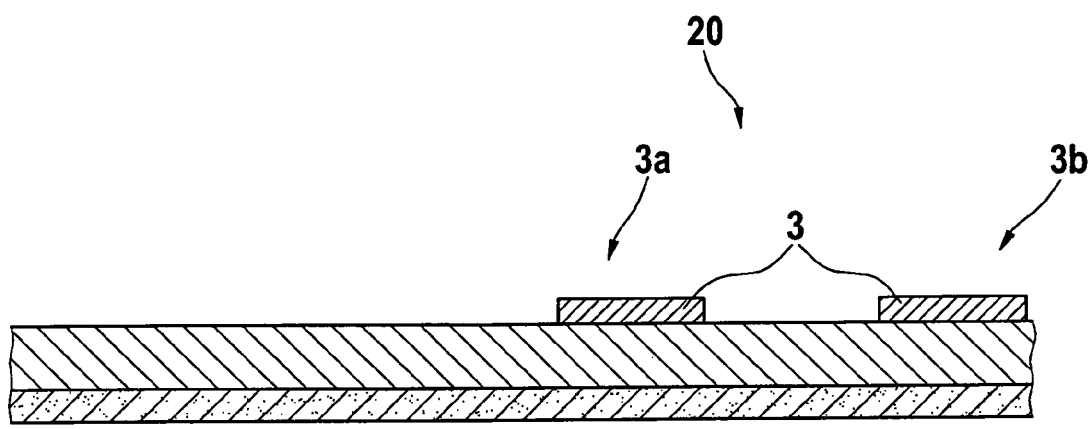

As shown in FIG. 3, a highly doped semiconductor layer 3 with a first conductivity type is deposited on buffer layer 2, and it is patterned using a first photomask such that the layer is retained only in contact areas 3a, 3b for the first type of transistor 20.

Figure 4:
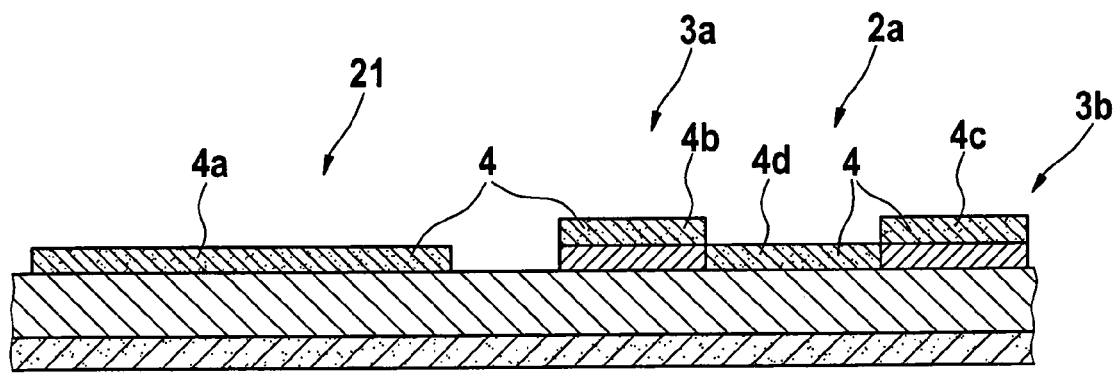

Next, an intrinsic semiconductor 4 is deposited over the entire surface. Intrinsic semiconductor 4 is patterned using a second mask, so that semiconductor islands are retained in areas for a first and second type of transistor 20, 21, as shown in FIG. 4. Semiconductor island 4a is provided for producing a second type of transistor 21. Semiconductor islands 4b, 4c are located above semiconductor layer 3 and therefore in contact areas 3a, 3b. Semiconductor island 4d represents the channel of the first type of transistor 20.

Figure 5:
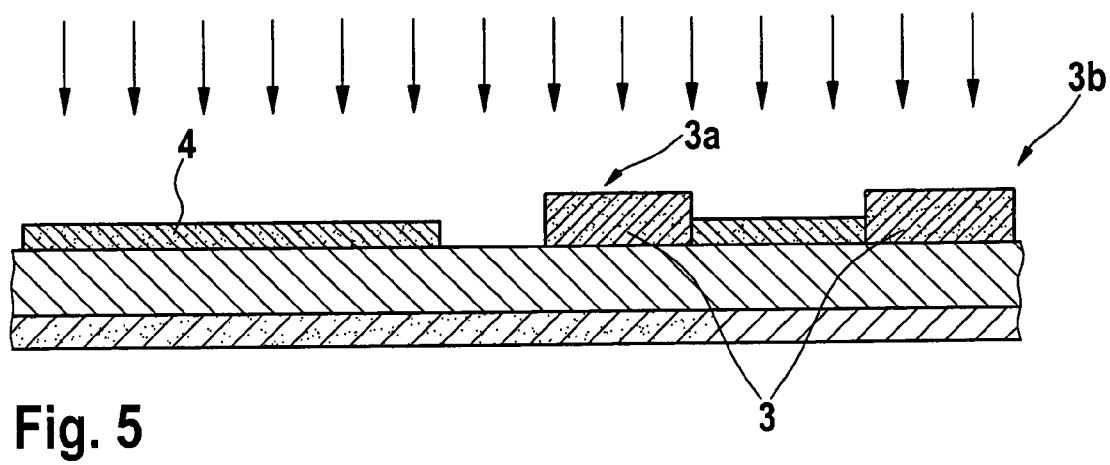

In the process step shown in FIG. 5, the dopants in semiconductor layer 3 are activated, and intrinsic semiconductor 4 is simultaneously recrystallized. The laser crystallization is carried out such that a highly-doped layer with a first conductivity type results in contact areas 3a, 3b via mixing.

Figure 6:
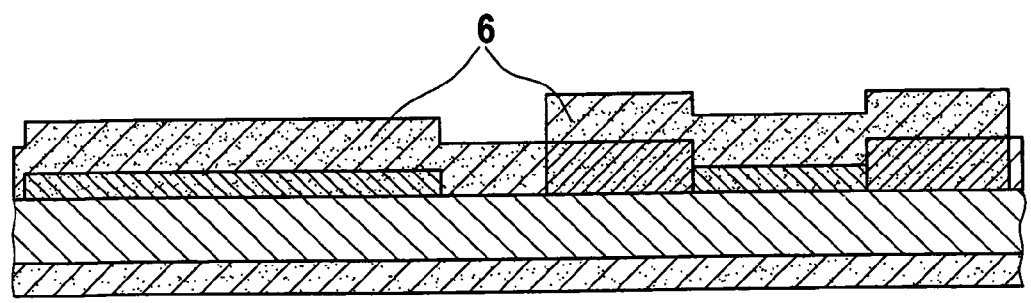
Figure 7:
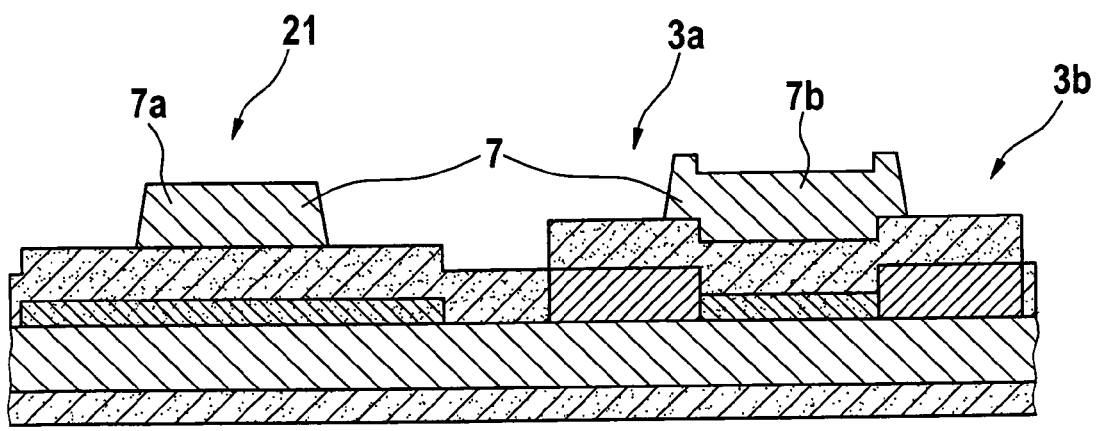

As shown in FIG. 6, a gate dielectric 6 is subsequently deposited over the entire surface. As shown in FIG. 7, a first conductive layer 7 is now deposited and subsequently patterned, so that gate electrodes 7a and 7b result. It can be seen that gate electrode 7a covers the eventual channel of the second type of transistor 21. Gate electrode 7b covers semiconductor island 4d that forms the channel, and it overlaps contact areas 3a, 3b. Gate dielectric 6 can be removed everywhere that a conductive layer of the first type (gate electrode) does not exist, so that ion doping can be carried out at low energies, e.g., using an ion shower.

Figure 8:
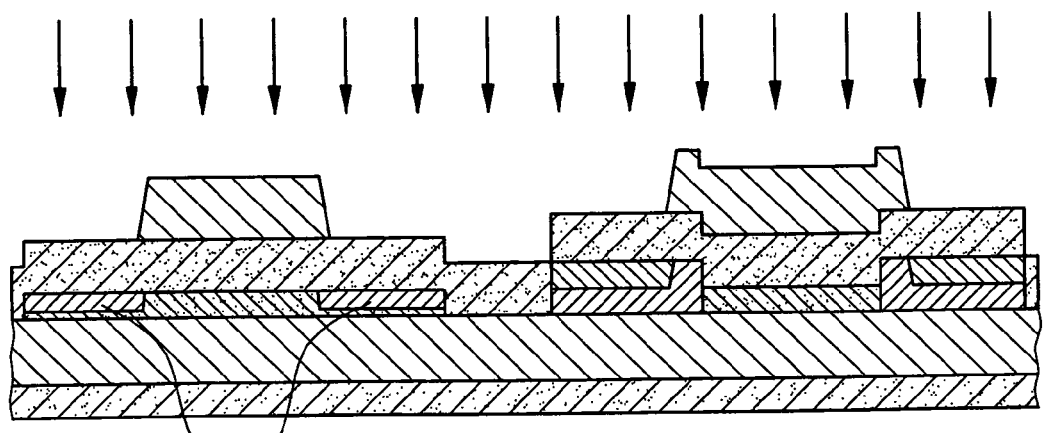

Subsequently, as shown in FIG. 8, ions are implanted and activated, gate electrodes 7a, 7b serving as masks. The first type of conductivity is retained in contact areas 3a, 3b, and areas with the second conductivity type are produced in contact areas 8.

Figure 9:
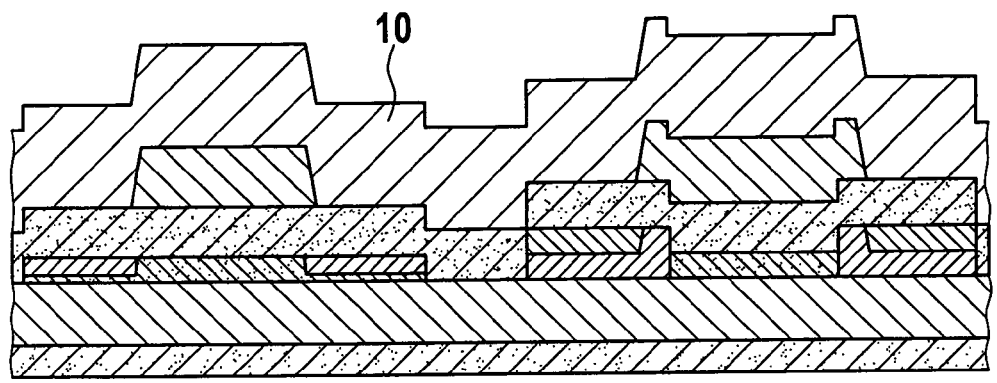
Figure 10:
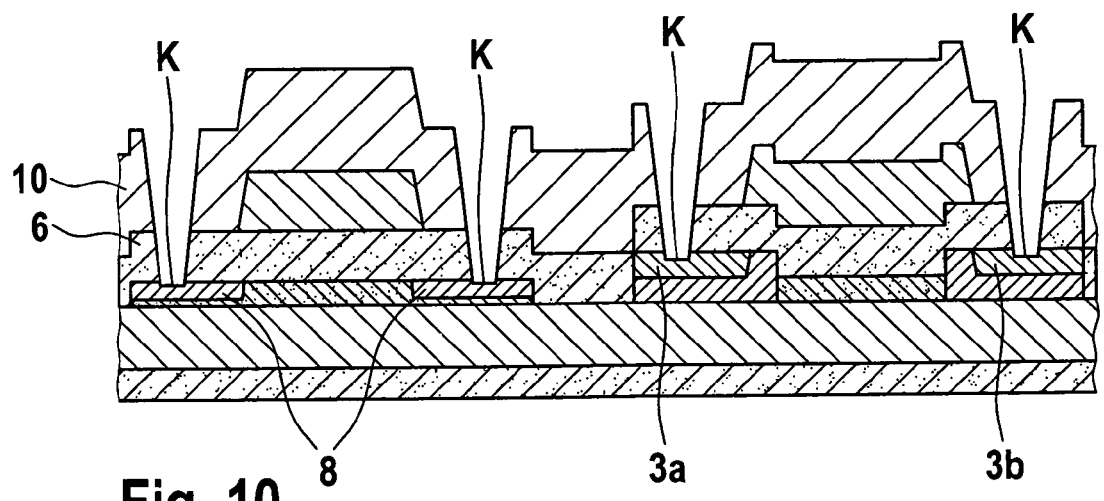

As shown in FIG. 9, a passivation layer 10 is deposited over the entire surface. As illustrated in FIG. 10, contact openings K through passivation layer 10 and gate dielectric 6 are opened, so that contact areas 3a, 3b, 8 and gate electrodes 7a, 7b of the transistors can be contacted. A further photomask is used for this purpose.

Figure 11:
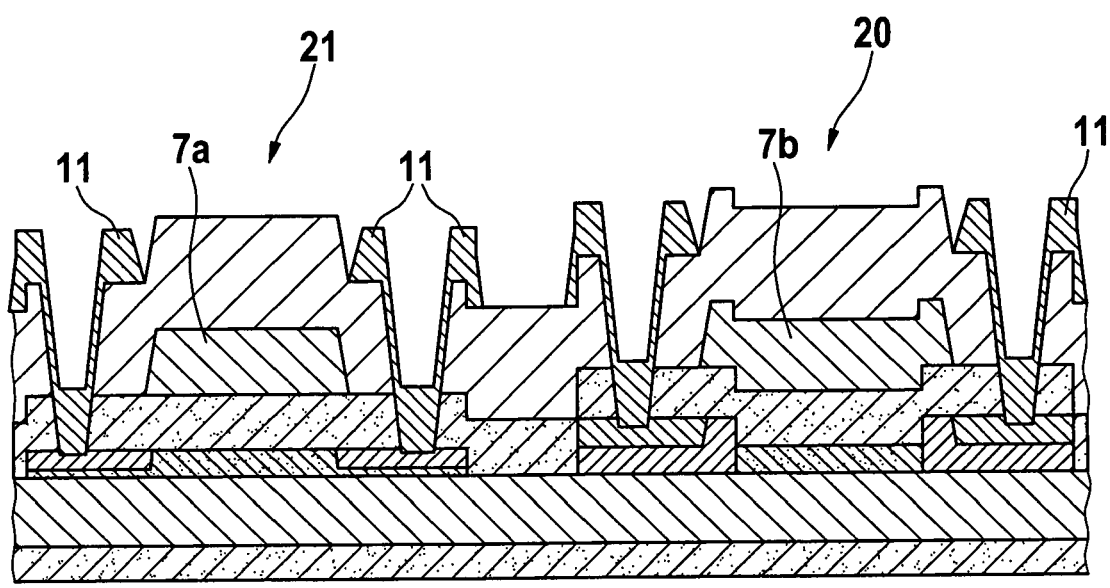

As shown in FIG. 11, a second conductive layer 11 is deposited and patterned using a mask such that transistors 20, 21 and gate electrodes 7a, 7b are connected in accordance with the desired switching properties.

It will be understood that each of the elements described above, or two or more together, may also find a useful application in other types of methods and constructions differing from the type described above.

While the invention has been illustrated and described as embodied in a method for manufacturing CMOS circuits, it is not intended to be limited to the details shown, since various modifications and structural changes may be made without departing in any way from the spirit of the present invention.

Without further analysis, the foregoing will so fully reveal the gist of the present invention that others can, be applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

The invention claimed is:

1. A method of manufacturing transistors of a first and second type on a substrate, comprising the following steps performed in the following sequence: producing doped semiconductor areas with a first conductivity type in eventual contact areas of a first type of transistors; depositing a first intrinsic semiconductor layer over an entire surface; activating dopants in the semiconductor areas such that a contact area with the first conductivity type is produced in the intrinsic semiconductor layer; depositing a gate dielectric; producing a gate electrode by depositing a first conductive layer and patterning the first conductive layer; performing ion doping with dopants to produce contact areas with a second conductivity type for a second type of transistor; depositing a passivation layer; opening contact openings; and depositing and patterning a second conductive layer.

2. A method as defined in claim 1, wherein said producing the doped semiconductor areas includes depositing a doped semiconductor layer and then patterning it.

3. A method of manufacturing transistors of a first type and of a second type on a substrate, comprising the steps of:
producing doped semiconductor areas with a first conductivity type in eventual contact areas of the first type of transistors;
depositing a first intrinsic semiconductor layer over an entire surface;
activating dopants in the semiconductor areas such that a contact area with the first conductivity type is produced in the intrinsic semiconductor layer;
depositing a gate dielectric;
producing a gate electrode by depositing a first conductive layer and patterning the first conductive layer;
performing ion doping with dopants to produce contact areas with a second conductivity type for the second type of transistor;
depositing a passivation layer;
opening contact openings; and
depositing and patterning a second conductive layer, wherein said producing the doped semiconductor areas includes depositing a second intrinsic semiconductor layer, doping said second semiconductor layer, and patterning said doped second intrinsic semiconductor layer.

4. A method as defined in claim 3, wherein said doping the second intrinsic semiconductor layer includes using ion doping.

5. A method as defined in claim 1; and further comprising activating the dopants of the doped semiconductor areas using a laser.

6. A method as defined in claim 1, wherein said depositing the first intrinsic semiconductor layer includes depositing the first intrinsic semiconductor layer as a layer selected from the group consisting of an amorphous layer and a microcrystalline layer, and subsequently crystallizing the deposited layer.

7. A method as defined in claim 6, wherein said subsequently crystallizing includes subsequently crystallizing the deposited layer so that said deposited layer forms a polycrystalline layer.

8. A method as defined in claim 1; and further comprising depositing a buffer layer on the substrate under doped semiconductor islands.

9. A method as defined in claim 1; and further comprising patterning the first intrincing semiconductor layer such that the semiconductor areas are retained, at least in contact areas for the first and second types of transistors.

10. A method as defined in claim 9, wherein said retaining includes retaining semiconductor islands that include contact areas and channels of the transistors are retained.

11. A method as defined in claim 1, wherein said ion doping includes ion doping with at least gate electrodes of the second type of transistor as a mask such that, in the contact areas with the first conductivity type, the first conductivity type is retained and the contact areas of the second type of transistors have a second conductivity type.

12. A method as defined in claim 1; and further comprising patterning the first conductivity layer such that the gate electrodes of the first type of transistor overlap at least part of the contact areas.

13. A method as defined in claim 1; and further comprising doping semiconductor islands so that the doped semiconductor islands are $n^+$-doped, and areas having a low concentration of doping agent are produced by activating the dopants in a direction of a channel.

14. A method as defined in claim 1; and further comprising opening of contact holes to the first conductive layer and down to the contact areas by using only one masking step.

* * * * *